United States Patent
Chuang et al.

(10) Patent No.: US 7,529,100 B2
(45) Date of Patent: May 5, 2009

(54) FLEXIBLE PRINTED CIRCUIT BOARD (FPC) FOR LIQUID CRYSTAL DISPLAY (LCD) MODULE

(75) Inventors: Meng Ju Chuang, Hsinchu (TW); Che-Kuei Mai, Hsinchu (TW)

(73) Assignee: TPO Displays Corp., Chu-Nan (TW)

( * ) Notice: Subject to any disclaimer, the term of this patent is extended or adjusted under 35 U.S.C. 154(b) by 630 days.

(21) Appl. No.: 10/914,214

(22) Filed: Aug. 10, 2004

(65) Prior Publication Data

US 2005/0128717 A1   Jun. 16, 2005

(30) Foreign Application Priority Data

Dec. 16, 2003   (TW)   ............... 92135532 A

(51) Int. Cl.
  *H05K 1/00*   (2006.01)
(52) U.S. Cl. ...................... 361/749; 174/254
(58) Field of Classification Search ........... 361/749, 361/752; 174/254, 256, 268; 349/149–150; 439/67, 77, 96
See application file for complete search history.

(56) References Cited

U.S. PATENT DOCUMENTS

| | | | | |
|---|---|---|---|---|
| 4,550,357 A | * | 10/1985 | Matsumoto | 361/749 |
| 5,061,830 A | * | 10/1991 | Ambrose | 200/5 A |
| 5,168,430 A | * | 12/1992 | Nitsch et al. | 361/749 |
| 5,341,806 A | * | 8/1994 | Gadsby et al. | 600/393 |
| 6,781,392 B1 | * | 8/2004 | Cheng et al. | 324/754 |
| 6,886,243 B2 | * | 5/2005 | Ishikawa et al. | 29/829 |
| 6,972,963 B1 | * | 12/2005 | Chou | 361/760 |
| 7,339,646 B2 | * | 3/2008 | Izawa et al. | 349/150 |
| 2002/0149914 A1 | * | 10/2002 | Karasawa et al. | 361/749 |
| 2005/0041401 A1 | * | 2/2005 | Chuang | 361/749 |
| 2005/0237725 A1 | * | 10/2005 | Cho et al. | 361/752 |
| 2006/0146261 A1 | * | 7/2006 | Izawa et al. | 349/149 |
| 2006/0164817 A1 | * | 7/2006 | Yoshida | 361/749 |

FOREIGN PATENT DOCUMENTS

WO   WO 2004038495 A1 * 10/2002
WO   PCT/JP02/11172   * 5/2004

* cited by examiner

*Primary Examiner*—Dean A. Reichard
*Assistant Examiner*—Abiy Getachew
(74) *Attorney, Agent, or Firm*—Quintero Law Office

(57) ABSTRACT

A flexible printed circuit board (FPC) with an extensible element for liquid crystal display (LCD) module is provided, wherein the extensible element can extend when it is forced. It can be used for different LCD modules to achieve the purpose of simplifying manufacturing process.

20 Claims, 5 Drawing Sheets

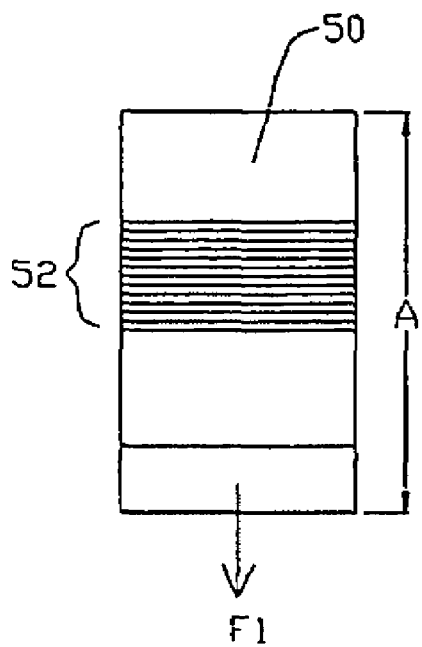 
FIG.5A  FIG.5B
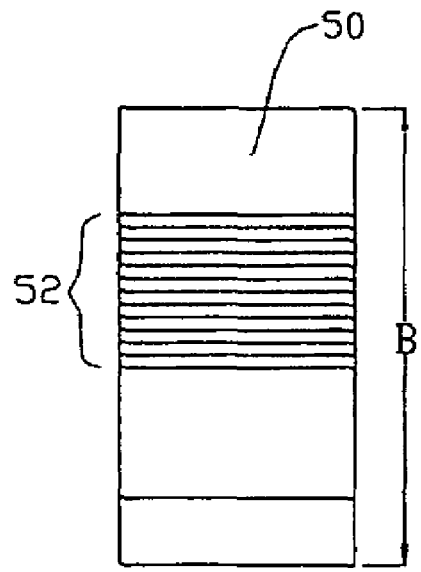 
FIG.6A  FIG.6B

FLEXIBLE PRINTED CIRCUIT BOARD (FPC) FOR LIQUID CRYSTAL DISPLAY (LCD) MODULE

RELATED APPLICATION

The present application is based on, claims priority from, Taiwan Application No. 92135532, filed Dec. 16, 2003, the disclosure of which is hereby incorporated by reference herein in its entirety.

BACKGROUND OF THE INVENTION

1. Field of the Invention

The invention relates to a flexible printed circuit board (FPC) for liquid crystal display (LCD) module, more particularly to a FPC with an extensible element for LCD module. It can be used in the different LCD modules to achieve the purpose of simplifying manufacturing process because the extensible element can be extended when it is applied a force.

2. Description of the Prior Art

While the science and technology evolved frequently, the display technology and the monitor played a very important role in the development process of the information technology. The portable devices and the display panel incorporated into each electric apparatus or meter, such as the computer, television, mobile phone, BP, and PDA (Personal Digital Assistant), provided large information in our daily life and work. Especially, the LCD (liquid crystal display), which has many advantages such as the low power consumption, low radiation, slim body and better display quality, becomes the main product in the plain display market.

As illustrated in FIG. 1, a LCD module 10, which uses the LED (Light Emitting Diode) as the light source, comprises a LCD panel 110, a LED back light source 120, a light source connecting FPC (flexible printed circuit board) 130, a panel connecting FPC 140, a connector 150 and a PCB (print circuit board) 160. The light source connecting FPC 130 connects the panel connecting FPC 140 via the connector 150. However, in consideration of the reliability and the thickness, another method to connect the light source connecting FPC 130 and the panel connecting FPC 140 on the PCB 160 is achieved by a bonding or a soldering process, so as to spare the space for the connector 150. Please refer to FIG. 2, the light source connecting FPC 130 and the panel connecting FPC 140 is mounted on the PCB 160 by the bonding or soldering process. One end of the light source connecting FPC 130 is connected with the back light source 120 and one end of the panel connecting FPC 140 is connected with the LCD panel 110, and the other ends of the both should be positioned and exactly connected to the PCB 160 by proper tools (not shown in FIG. 2). Then, the light source connecting FPC 130 and the panel connecting FPC 140 are turned over to the reverse side of the LED back light source 120. Due to the different radiuses of these two FPCs, it is resulted in one protruding length (L') on the light source connecting FPC 130 other than the panel connecting FPC 140 as illustrated in FIG. 2. The circuit on the light source connecting FPC 130 can supply the power to the LED back light source 120, and the circuit on the panel connecting FPC 140 can transmit signal to control the LCD panel 110. The above back light source 120 uses the LED as the light source. In fact, the light source for the back light source 120 can also be CCFL (Cold Cathode Fluorescent Lamp) or other similar luminous components.

Because a FPC has flexibility and can be curved to a predetermined shape without damaging itself and the circuit thereon, it is used to serves as the light source connecting FPC 130 and the panel connecting FPC 140. Please refer to FIG. 3, three FPCs 310, 320, 330 in different size but with same circuit layout are shown for being applied to different types of LCD modules 31, 32, 33. One end of the FPC 310/320/330 is connected to a LCD panel 312/322/332 and the other end of the FPC 310/320/330 is soldered to a pad 314/324/334 on the PCB (not shown in FIG. 3). It increases the complication of preparing the material and the space of storing the FPC. Sometimes, the shape of the FPC must be redesign once the position of the pad on the PCB is changed. As illustrated in FIG. 4, the shape of a FPC 410 is redesign to the shape of a FPC 420, there being same circuit layout thereon, in order to be applied to the condition that the position of the pad on the PCB is changed. It not only spends time but also wastes resource to design different FPC shapes for different LCD modules. Therefor, we need a FPC with same circuit layout to be directly applied to different LCD modules.

SUMMARY OF THE INVENTION

In light of the state of the art described above, it is an object of the present invention to provide a FPC with an extensible element applicable to different LCD modules by extending the FPC to a predetermined length when a force is applied thereon. The FPC is flexible subject to its elasticity by utilizing the extensible element, and it is easy and cheap to implement this invention.

It is another object of this invention to provide a FPC with an extensible element that can be applied to different LCD modules, wherein the FPC and the extensible element can be manufactured in a single (all-in-one) process.

It is a further object of this invention to provide a FPC with an extensible element that can be applied to different LCD modules. After the FPC is turned over, its length will be shortened, due to the shorter distance and the elastic force between two ends thereof, to reduce the protruding length.

In view of the above and other objects which will become apparent as the description proceeds, there is provided according to a general aspect of the present invention a flexible printed circuit board (FPC) for liquid crystal display (LCD) module that comprises a first end connected to a LCD panel, a second end connected to a printed circuit board (PCB), a circuit on said FPC connecting electrically said LCD panel and said PCB, and an extensible element that could extend to a first length when a force is applied thereon.

Base on the idea described above, said extensible element and said FPC are manufactured in a single (all-in-one) process.

Base on the aforementioned idea, said extensible element extends to said first length in a longitudinal direction upon a force applied thereon.

Base on the idea described above, said extensible element extends to said first length in a laterally direction upon a force applied thereon.

Base on the aforementioned idea, the shape of the cross section view of said extensible element is one selected from the group consisting of embossing, saw-tooth and arc.

Base on the idea described above, the shape of the cross section view of said extensible element is composed of at least two ones selected from the group consisting of embossing, saw-tooth and arc.

Base on the aforementioned idea, the shape of the cross section view of said extensible element is continuous.

Base on the idea described above, the material of said FPC is one selected from the group consisting of Polymer and Polyester.

Base on the aforementioned idea, said extensible element is located in a straightaway portion of said FPC so as to extend to said first length in a longitudinal direction.

Base on the idea described above, wherein said extensible element is located in an oblique portion of said FPC so as to extend to said first length in a laterally direction.

In view of the above and other objects which will become apparent as the description proceeds, there is provided according to a general aspect of the present invention a flexible printed circuit board (FPC) with an extensible element that extends to a first length upon a force applied thereon.

Base on the idea described above, said extensible element and said FPC are manufactured in a single (all-in-one) process.

Base on the aforementioned idea, said extensible element extends to said first length in a longitudinal direction upon a force applied thereon.

Base on the idea described above, said extensible element extends to said first length in a laterally direction upon a force applied thereon.

Base on the aforementioned idea, the shape of the cross section view of said extensible element is one selected from the group consisting of embossing, saw-tooth and arc.

Base on the idea described above, the shape of the cross section view of said extensible element is composed of at least two ones selected from the group consisting of embossing, saw-tooth and arc.

Base on the aforementioned idea, the shape of the cross section view of said extensible element is continuous.

Base on the idea described above, the material of said FPC is one selected from the group consisting of Polymer and Polyester.

Base on the aforementioned idea, said extensible element is located in a straightaway portion of said FPC so as to extend to said first length in a longitudinal direction.

Base on the idea described above, wherein said extensible element is located in an oblique portion of said FPC so as to extend to said first length in a laterally direction.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A and 5B illustrate a top view and a side view of the FPC according to a first embodiment of this invention respectively, wherein the FPC is not forced yet;

FIGS. 6A and 6B illustrate a top view and a side view of the FPC according to the first embodiment of this invention respectively, wherein the FPC extends to a predetermined length upon a force applied on one end thereof;

DESCRIPTION OF THE PREFERRED EMBODIMENT

Some illustrated embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

The material of FPC is Polymer or Polyester. Such board has flexibility, and can be curved to a predetermined shape without damaging itself and the circuit thereon. Hence, the basic concept of this invention is to design a portion of the FPC as an extensible element so as to fit different sizes of LCD modules. An FPC 50 according to a first embodiment of this invention is illustrated in FIGS. 5A and 5B. FIG. 5A shows a top view of the FPC 50 and FIG. 5B shows a side view of the FPC 50. An extensible element 52 provided in the FPC 50 according to this embodiment presents a shape of an embossing and/or a saw-tooth. When one end of the FPC 50 is fixed and the other end of the FPC 50 is pulled by a force F1 (pulling force), the FPC 50 can be extended to a predetermined length without damaging itself and the circuit thereon. The top view and the side view of the FPC 50 under an extended situation are illustrated in FIGS. 6A and 6B. Its longitudinal length is changed from an unextended length A to an extended length B (B>A). Therefore, the FPC 50 provided with the extensible element 52 can be applied to any the LCD modules that need a longitudinal length between A and B so as to achieve the purpose of applying a single FPC to different LCD modules and the demand of simplifying producing procedures. The extensible element 52 of the PFC 50 can be formed by adding a hot-press step, which does not destroy the circuit layout thereon, in the manufacturing process of the PFC.

Figure 1:
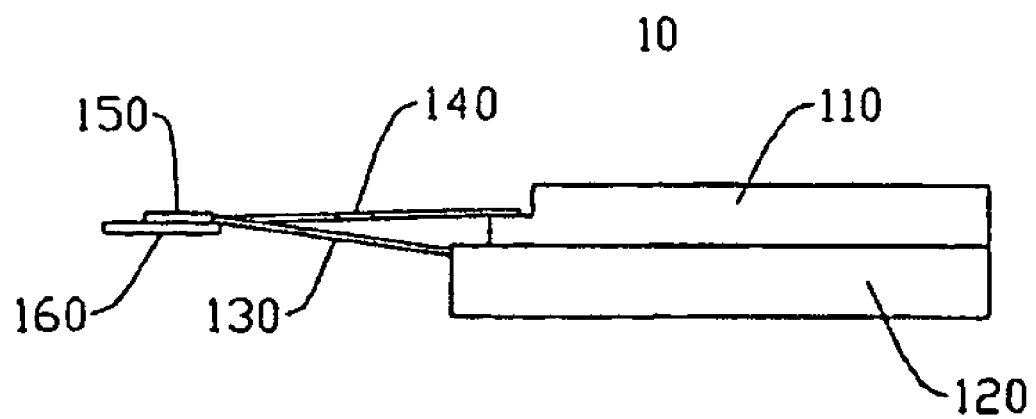
FIG. 1 illustrates a view of a conventional LCD module using a connector to connect the light source connecting FPC and the panel connecting FPC on the PCB.
Figure 2:
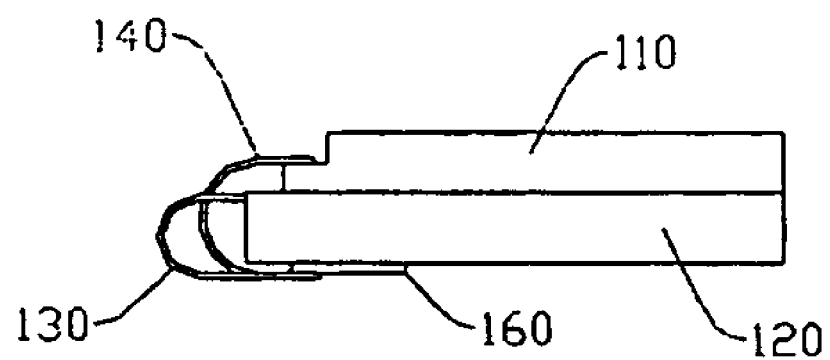
FIG. 2 illustrates a view of a conventional LCD module to connect the light source connecting FPC and the panel connecting FPC on the PCB by a bonding or soldering process.
Figure 3:
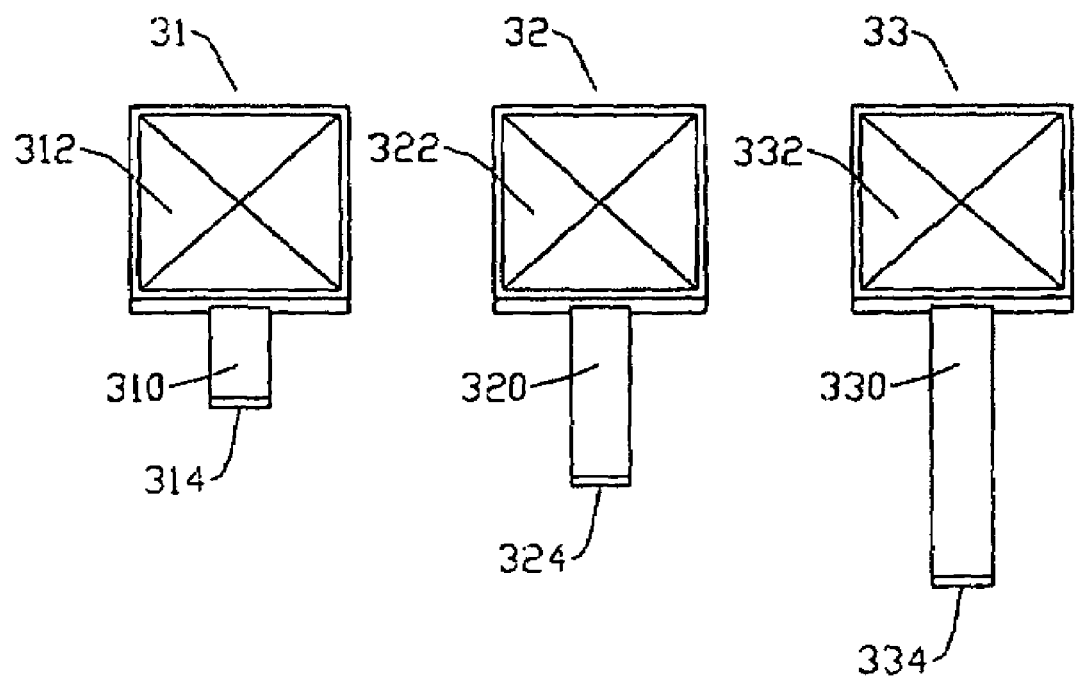
FIG. 3 illustrates three FPCs in different size but with same circuit layout for being applied to different types of LCD modules.
Figure 4:
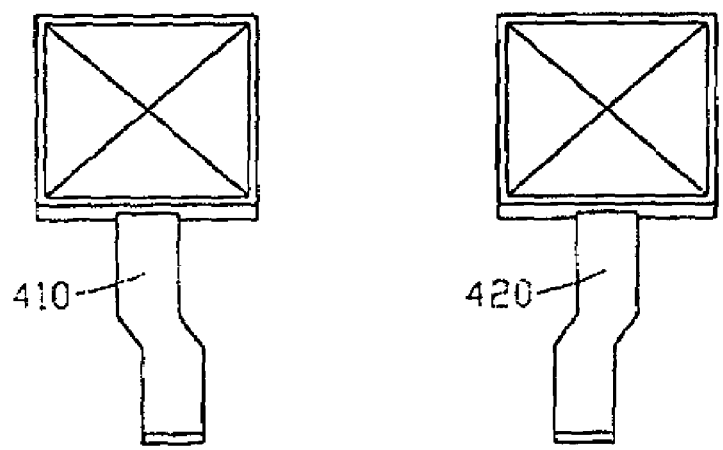
FIG. 4 illustrates a shape of the FPC that must be redesigned once for the position of a pad on the PCB is changed.
Figure 7A:
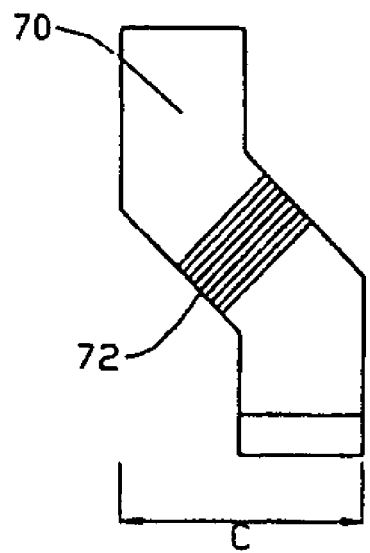
FIG. 7A illustrates a top view of the FPC according to a second embodiment of this invention, wherein the FPC is not forced yet.
Figure 7B:
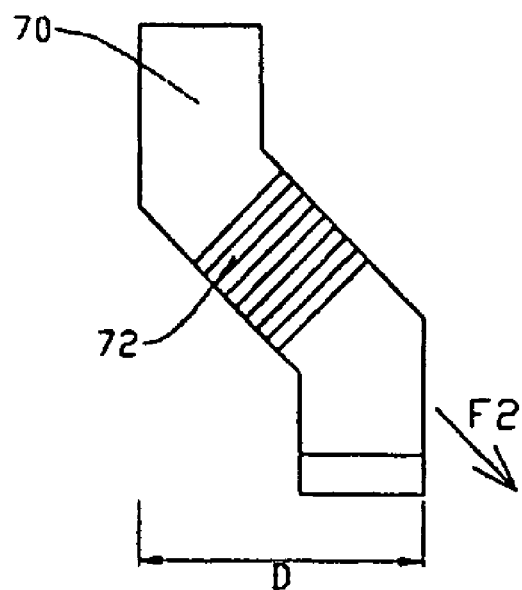
FIG. 7B illustrates a top view of the FPC according to the second embodiment of this invention, wherein the FPC extends to a predetermined length upon a force applied on one end thereof.

An FPC 70 according to a second embodiment of this invention is illustrated in FIGS. 7A and 7B. FIG. 7A shows a top view of the FPC 70 that is not forced yet and FIG. 7B shows a top view of the FPC 70 that has been forced. An extensible element 72 provided in the FPC 70 is located in an oblique portion of the FPC 70 according to this embodiment of the present invention. When one end of the FPC 70 is fixed and the other end of the FPC 70 is pulled by a force F2 (pulling force), the FPC 70 can be extended to a predetermined length without damaging itself and the circuit thereon. Its lateral length is changed from an unextended length C to an extended length D (D>C). Therefore, the FPC 70 with extensive element 72 can be applied to any LCD modules that need a lateral length between C and D and thus achieves the purpose of applying a single FPC to different LCD modules and the demand of simplifying producing procedures.

Figure 8A:
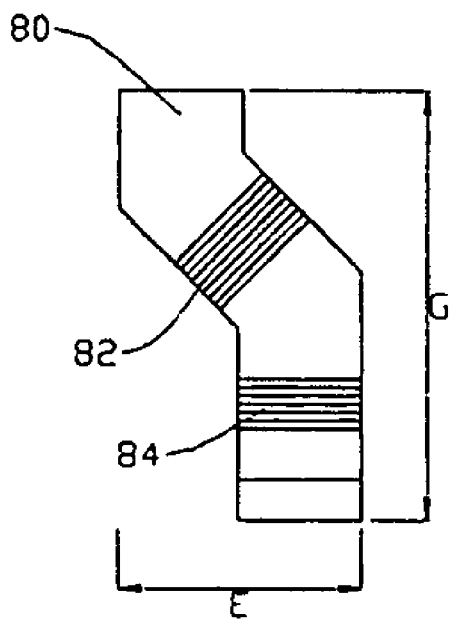
FIG. 8A illustrates a top view of the FPC according to a third embodiment of this invention, wherein the FPC is not forced yet.
Figure 8B:
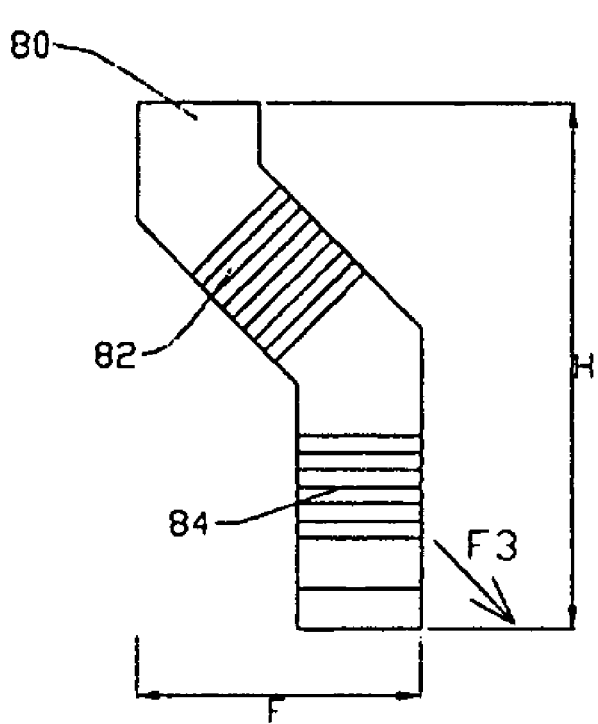
FIG. 8B illustrates a top view of the FPC according to the third embodiment of this invention, wherein the FPC extends to a predetermined length upon a force applied on one end thereof.

Besides, two or more extensible elements can be formed in a single FPC. An FPC 80 according to a third embodiment of this invention is illustrated in FIGS. 8A and 8B. FIG. 8A shows a top view of the FPC 80 that is not forced yet and FIG. 8B shows a top view of the FPC 80 that is forced. An extensible element 82 is located in an oblique portion of the FPC 80 and an extensible element 84 is located in a straightaway portion of the FPC 80 according to this embodiment of the present invention. When one end of the FPC 80 is fixed and the other end of the FPC 80 is pulled by a force F3 (pulling force), the FPC 80 can extends to a predetermined length without damaging itself and the circuit thereon. Not only its longitudinal length is changed from an unextended length E to an extended length F (F>E), but also its lateral length is changed from an unextended length G to an extended length H (H>G). Therefore, the FPC 80 provided with the extensible elements 82, 84 can be applied to any LCD modules that need longitudinal length between E and F and lateral length between G and H simultaneously.

Figure 9A:
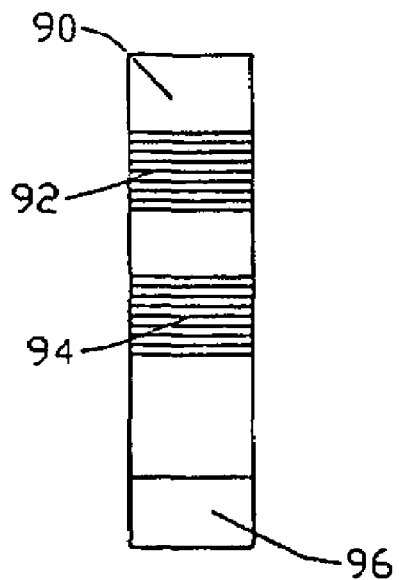
FIG. 9A illustrates a top view of the FPC according to a fourth embodiment of this invention, wherein the FPC is not adjusted to a predetermined shape yet.
Figure 9B:
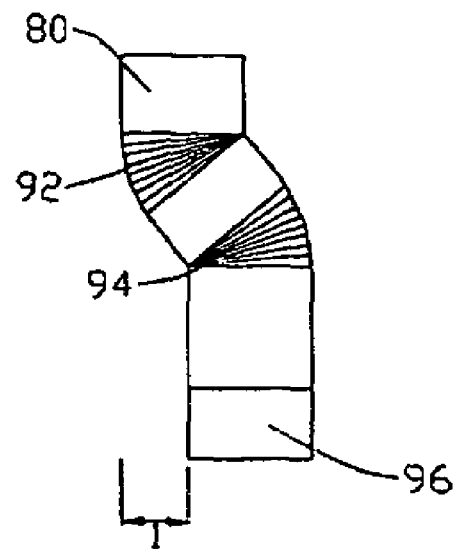
FIG. 9B illustrates a top view of the FPC according to the fourth embodiment of this invention, wherein the FPC is adjusted to the predetermined shape.

An FPC 90 according to a fourth embodiment of this invention is illustrated in FIGS. 9A and 9B. FIG. 9A shows a top view of the FPC 90 that is not adjusted to a predetermined shape yet and FIG. 9B shows a top view of the FPC 90 that is adjusted to a predetermined shape. Extensible elements 92, 94 are located in oblique portions of the FPC 90 according to this embodiment of the present invention. We can adjust two ends of the FPC 90 laterally with a movement of a distance I without damaging itself and the circuit thereon. Therefore, the FPC 90 with the extensible elements 92, 94 can be applied to a condition that the position of the pad in the LCD module is changed.

Figure 10:
FIG. 10 illustrates a cross section view of another extensible element of the FPC according to another embodiment of this invention.

Although only the extensible elements having an embossing and/or saw-tooth shape are shown in the above FIGs, any extensible elements with any geometric shapes, which can be flexible in any special directions, fall in the scope of this invention. For example, please refer to FIG. 10, an extensible element in an arc shape is also available for this invention. Certainly, subject to the actual need, such shape (e.g. embossing, saw-tooth, and arc) can be designed as several continuous or non-continuous parts or a combination thereof.

In accordance with the above concept, we can design the FPC in the shorter length, which can be extended to a predetermined length without damaging itself and the circuit thereon when it is connected on the PCB for bonding or soldering. After the FPC is turned over, the length of such board is shorter than the predetermined length due to the shorter distance and the elastic force between two ends thereof. Because the two ends thereof are fixed, the protruding length of the FPC can be reduced so as to spare the space.

This invention provides a FPC with an extensible element that can be applied to different LCD modules without increasing complication of preparing the material and the space of storing the FPC. The FPC is flexible subject to its elasticity by utilizing the extensible element, and it is easy and cheap to implement this invention. Besides, this invention can not only be applied to the LCD module, but also any product which uses a FPC.

Although the specific embodiments have been illustrated and described, it will be obvious to those skilled in the art that various modifications may be made without departing from what is intended to be limited solely by the appended claims.

What is claimed is:

1. A flexible printed circuit board (FPC) for liquid crystal display (LCD) module, comprising:
   a first end connected to a LCD panel;
   a second end connected to a printed circuit board (PCB);
   a circuit on said FPC for connecting electrically said LCD panel and said PCB; and
   an extensible element disposed between the first end and the second end, wherein when a force is applied on the extensible element, the length between the first end and the second end is extended.

2. The FPC according to claim 1, wherein said extensible element and said FPC are manufactured in a single (all-in-one) process.

3. The FPC according to claim 1, wherein said extensible element extends to said first length in a longitudinal direction.

4. The FPC according to claim 1, wherein said extensible element extends to said first length in a lateral direction.

5. The FPC according to claim 1, wherein said extensible element has a cross-section shape selected from the group consisting of an embossing, a saw-tooth and an arc.

6. The FPC according to claim 5, wherein said extensible element has a cross-section shape consisting at least two of the shapes selected from the group consisting an an embossing, a saw-tooth and an arc.

7. The FPC according to claim 5, wherein the cross section shape of said extensible element is continuous.

8. The FPC according to claim 1, wherein the material of said FPC is one selected from the group consisting of Polymer and Polyester.

9. The FPC according to claim 3, wherein said extensible element is located in a straightaway portion of said FPC for longitudinally extending to said first length.

10. The FPC according to claim 4, wherein said extensible element is located in an oblique portion of said FPC for laterally extending to said first length.

11. A flexible printed circuit board (FPC) comprising a first end, a second end, and an extensible element disposed between the first end and the second end, wherein when a force is applied on the extensible element, the length between the first end and the second end is extended.

12. The FPC according to claim 11, wherein said extensible element and said FPC are manufactured in a single (all-in-one) process.

13. The FPC according to claim 11, wherein said extensible element extends to said first length in a longitudinal direction.

14. The FPC according to claim 11, wherein said extensible element extends to said first length in a lateral direction.

15. The FPC according to claim 11, wherein said extensible element has a cross-section shape selected from the group consisting of an embossing, a saw-tooth and an arc.

16. The FPC according to claim 15, wherein said extensible element has a cross-section shape consisting at least two of the shapes selected from the group consisting an embossing, a saw-tooth and an arc.

17. The FPC according to claim 15, wherein the cross section shape of said extensible element is continuous.

18. The FPC according to claim 11, wherein the material of said FPC is one selected from the group consisting of Polymer and Polyester.

19. The FPC according to claim 13, wherein said extensible element is located in a straightaway portion of said FPC for longitudinally extending to said first length.

20. The FPC according to claim 14, wherein said extensible element is located ia an oblique portion of said FPC for laterally extending to said first length.

* * * * *